United States Patent
Ballon

(10) Patent No.: US 7,019,338 B1
(45) Date of Patent: Mar. 28, 2006

(54) SUBSCRIBER INTERFACE PROTECTION CIRCUIT

(75) Inventor: Christian Ballon, Tours (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/367,645

(22) PCT Filed: Dec. 29, 1998

(86) PCT No.: PCT/FR98/02907

§ 371 (c)(1),
(2), (4) Date: Sep. 6, 2001

(87) PCT Pub. No.: WO99/35692

PCT Pub. Date: Jul. 15, 1999

(30) Foreign Application Priority Data

Dec. 30, 1997 (FR) .................. 97 16854

(51) Int. Cl.
  *H01L 29/74* (2006.01)
  *H01L 23/62* (2006.01)
(52) U.S. Cl. .................. 257/173; 257/355; 257/362
(58) Field of Classification Search ........ 257/173–174, 257/355–363
See application file for complete search history.

(56) References Cited

U.S. PATENT DOCUMENTS 5,243,488 A   9/1993   Bernier et al.
5,274,524 A   12/1993  Pezzani et al.
5,304,823 A   4/1994   Byatt
5,684,322 A   11/1997  Bernier
5,696,391 A   12/1997  Bernier
5,828,089 A * 10/1998  Bernier ...................... 257/173

FOREIGN PATENT DOCUMENTS

| EP | 0 388 022    | 9/1990  |
| EP | 0 687 051 A1 | 12/1995 |
| EP | 0 721 218    | 7/1996  |
| EP | 0 742 592 A1 | 11/1996 |

OTHER PUBLICATIONS

International Search Report for PCT/FR 98/02907 filed Dec. 29, 1998.

* cited by examiner

*Primary Examiner*—Ori Nadav
(74) *Attorney, Agent, or Firm*—Lisa K. Jorgenson; William R. McClellan; Wolf, Greenfield & Sacks, P.C.

(57) ABSTRACT

The present invention relates to a monolithic component of protection of a line against overvoltages than a determined positive threshold or smaller than a determined negative threshold, including in antiparallel a cathode-gate thyristor (Th1) and an anode-gate thyristor (Th2), the gate of the cathode-gate thyristor being connected to a negative threshold voltage (−V) via a gate current amplification transistor (T1), the gate of the anode-gate thyristor being connected to a positive threshold voltage (+V). The monolithic component is made in a substrate divided into wells separated by isolating walls (3, 4), the smaller surfaces of which are coated with insulating layers (5, 6), the smaller surface of the substrate being uniformly coated with a metallization (M1).

14 Claims, 4 Drawing Sheets

US 7,019,338 B1

SUBSCRIBER INTERFACE PROTECTION CIRCUIT

BACKGROUND OF THE INVENTION

1. Field of the Invention

The present invention relates to circuits that protect against overvoltages, which circuits can be used in particular for subscriber line interface circuits (SLIC).

2. Discussion of the Related Art

Telephone circuits connected to lines are particularly likely to be disturbed by overvoltages such as lightning discharges or accidental connections to lines of the electric power network. Further, the problem of the protection of interface circuits becomes more and more acute as these interface circuits are formed of more and more integrated circuits of smaller and smaller dimensions and accordingly, more and more sensitive to overvoltages.

The applicant has been studying SLIC protection circuits for many years and has already devised several novel circuits, monolithically implementable, which are described, in particular, in U.S. Pat. Nos. 5,274,524, 5,243,488, 5,696,391 and 5,684,322, and in European patent applications 0742592 and 0687051.

SUMMARY OF THE INVENTION

The present invention aims at implementing a monolithic protection circuit capable of establishing a short-circuit between each conductor of a line and a ground when the voltage on this conductor exceeds a determined positive threshold or becomes lower than a predetermined negative threshold.

The present invention also aims at implementing such a circuit which also establishes a short-circuit between a line conductor and the ground when the current in this conductor exceeds a determined threshold.

The present invention aims at implementing such a circuit which can be manufactured by technologies compatible with that of power integrated circuits developed by the applicant.

Another object of the present invention is to provide such a circuit which is particularly reliable in operation.

Another object of the present invention is to provide such a circuit in which the on-state voltage drop is minimum (equal to the voltage drop across a thyristor only).

Another object of the present invention is to provide such a circuit which requires a very low current to be started.

To achieve these objects, the present invention provides a monolithic component that protects against line overvoltages greater than a determined positive threshold or lower than a determined negative threshold, including in antiparallel a cathode-gate thyristor and an anode-gate thyristor connected between a first terminal of the line to be protected and a reference voltage, the gate of the cathode-gate thyristor being connected to a negative threshold voltage via a gate current amplification transistor, the gate of the anode-gate thyristor being connected to a positive threshold voltage. The monolithic component is made in a substrate of the first conductivity type divided into wells separated by isolating walls, the lower surfaces of which are coated with insulating layers, the lower surface of the substrate being uniformly coated with a metallization. The gate current amplification transistor of the cathode-gate thyristor is made in vertical form in a first well. The cathode-gate thyristor is implemented in vertical form in a second well. The anode-gate thyristor is implemented in vertical form in a third well. The lower surface metallization links up the collector of the transistor, the anode of the cathode-gate thyristor, and the cathode of the anode-gate thyristor. A first front surface metallization connects the cathode of the cathode-gate thyristor to the anode of the anode-gate thyristor. A second front surface metallization connects the gate of the cathode-gate thyristor to the emitter of the transistor. A third front surface metallization is in contact with the gate of the anode-gate thyristor.

According to an embodiment of the present invention, the component further includes a diode, the anode of which is connected to the gate of the anode-gate thyristor. This diode is implemented in the form of a P-type region itself formed in an N-type region, the latter being formed in the cathode-gate region of the anode-gate thyristor, on the upper surface side of the component.

According to an embodiment of the present invention, the gate of the cathode-gate thyristor is connected to a second terminal of the line to be protected associated with the anode-gate thyristor, this transistor, of PNP type, being formed on the upper surface of the component, the collector region extending via isolating walls towards the lower surface and being in contact with the lower surface metallization.

BRIEF DESCRIPTION OF THE DRAWINGS

The foregoing objects, features and advantages of the present invention, will be discussed in detail in the following non-limiting description of specific embodiments in connection with the accompanying drawings wherein.

DETAILED DESCRIPTION

Figure 1A:
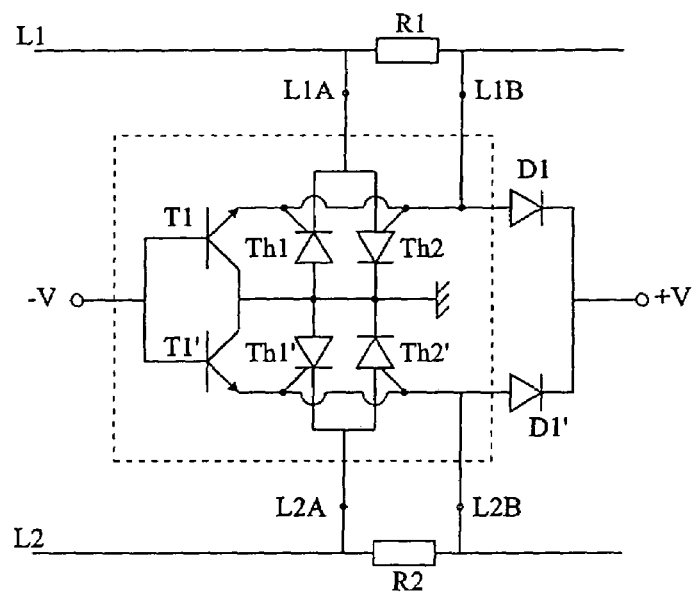
FIG. 1A shows an example of a protection circuit.

FIG. 1A shows a circuit that protects against overvoltages and overcurrents on a telephone line L1–L2. Each of the conductors of the telephone line includes a series resistor, respectively R1, R2, enabling to detect overcurrents. The terminals of resistor R1 which form first input terminals of the circuit according to the present invention will be called L1A and L1B and the terminals of resistor R2 which form second input terminals of the circuit will be called L2A and L2B. Between terminal L1A and a reference potential, currently the ground, two antiparallel thyristors, that is, a cathode-gate thyristor Th1 and an anode-gate thyristor Th2, are arranged. The anode of thyristor Th1 and the cathode of thyristor Th2 are grounded, and the cathode of thyristor Th1 and the anode of thyristor Th2 are connected to terminal L1A. The gate of the cathode-gate thyristor is connected to a negative voltage source −V via an NPN-type amplifier transistor T1. The gate of the anode-gate thyristor is connected to a positive voltage source +V (in this embodiment, via a diode D1). The gates of thyristors Th1 and Th2 are connected to terminal L1B. The emitter of transistor T1 is connected to terminal L1B, its collector to the ground and its base to negative voltage −V. This assembly forms the system of protection against overvoltages and overcurrents of conductor L1. Symmetrically arranged components designated by dashed references form the protection against overvoltages and overcurrents of line L2. The operation of this circuit which will be better understood by referring to the patents and patent applications of the applicant mentioned hereabove is the following.

If a positive overvoltage greater than voltage +V occurs on conductor L1, a current flows from the anode to the gate of anode-gate thyristor Th2 via diode D1 towards voltage +V. Thyristor Th2 turns on and shunts the overvoltage to ground.

If a negative overvoltage lower than voltage −V occurs on conductor L1, cathode-gate thyristor Th1 turns on and the negative overvoltage flows towards the ground. Transistor T1 increases the triggering sensitivity by acting as a gate amplifier.

If a positive current flows through resistor R1 to generate across this resistor a voltage greater than the threshold voltage of anode-gate thyristor Th2, the latter turns on.

If a negative current flows through resistor R1, cathode-gate thyristor Th1 turns on.

A device that protects against overvoltages and overcurrents on conductor L1 has thus effectively been obtained. The lower portion of the circuit performs the same function for conductor L2.

It should be noted that the values of voltages +V and −V, which will for example be provided by batteries, are not necessarily equal.

The function of diodes D1 and D1' is to isolate batteries +V and −V from each other, as well as from lines L1 and L2 in the absence of overvoltages.

Figure 1B:
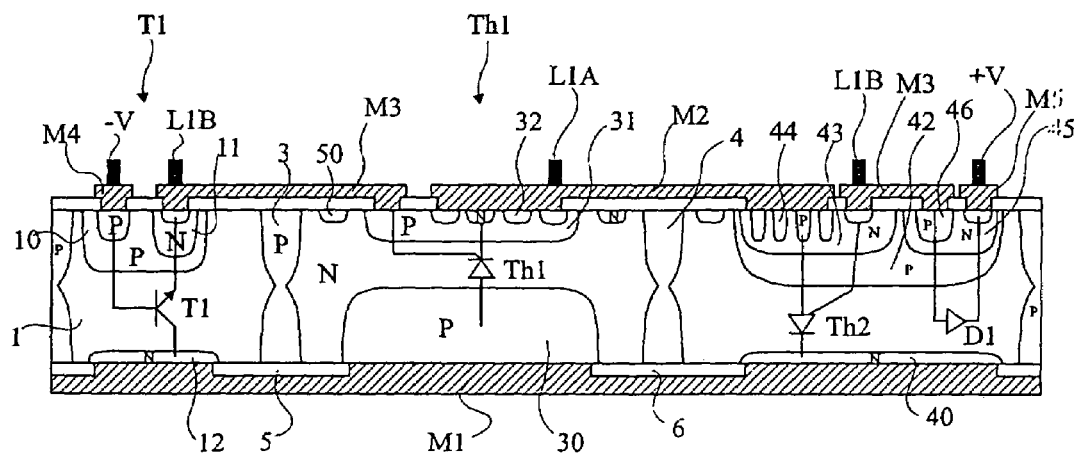
FIG. 1B shows an embodiment according to the present invention of the circuit of FIG. 1A.

FIG. 1B is a simplified cross-sectional view of a semiconductive wafer incorporating the circuit of FIG. 1A. only those elements belonging to the upper portion of the protection circuit of FIG. 1A are shown in FIG. 1B. The symmetrical components in the circuit are formed in the same way in the same silicon wafer, as will clearly appear to those skilled in the art.

The component of FIG. 1B is formed from an N-type substrate 1 divided into three wells by isolating walls 3 and 4. Each isolating wall is formed by a P-type drive-in extending from the upper and lower surfaces of the layer, with these diffusions joining substantially at the middle of the wafer. The component is performed in a semiconductor power component technology in which a single metallization M1 covers the entire lower surface or rear surface of the component. According to an aspect of the present invention, a technology in which the apparent portion of each isolating wall on the lower surface side is insulated by an insulating layer is used. Reference 5 designates an insulating layer, currently silicon oxide, formed under the lower surface of isolating wall 3 and reference 6 designates an insulating layer formed under the lower surface of isolating wall 4.

Transistor T1 is formed in the left-hand well. This transistor is of vertical type and includes on the upper surface side a P-type base region 10 containing an N-type emitter region 11. On the lower surface side is formed an N+-type region 12 forming the collector contact recovered by metallization M1. It should be noted that insulating layer 5 extends so that metallization M1 contacts N region 12 and not substrate 1 of the well. An advantage of implementing this transistor in vertical form is that it can easily withstand relatively high voltages (voltage −V is for example −50 V). Further, the connection between the collector of this transistor and the anode of cathode-gate thyristor Th1 is performed in a particularly simple and efficient way by the rear surface metallization. Further, transistor T1 has a high gain (on the order of 80 to 200) which results in a particularly low current to be supplied by battery −V upon each triggering.

Cathode-gate thyristor Th1 is formed in the central well of FIG. 1B. It is implemented in vertical form. It includes on the lower surface side an anode region 30 and on the upper surface side a P-type region 31 and an N-type cathode region 32, currently provided with emitter short-circuits. It should be noted that insulating regions 5 and 6 extend to P region 30 so that metallization M1 does not contact the N-type central well.

In the right-hand well of FIG. 1B are formed anode-gate thyristor Th2 and diode D1. Thyristor Th2 is made in the same way as thyristor Th1 in vertical form. It includes on the lower surface side an N cathode region 40, and on the upper surface side a deep lightly-doped P-type region 42 (made at the same time as anode region 30 of thyristor Th1) in which are formed an N-type region 43 and a P-type anode region 44. Conventionally, the anode region is provided with emitter short-circuits. Diode D1 is formed in P-type region 42 and includes in this region an N-type region 45 forming its cathode and a P-type region 46 forming its anode. This diode is a lateral diode.

On the upper surface side, the contacts are made by several metallizations:
  a metallization M2 connected to terminal L1A connecting the cathode of the cathode-gate thyristor to the anode of the anode-gate thyristor,
  a metallization M3 connected to terminal L1B connecting the gate of the cathode-gate thyristor to the emitter of transistor T1 and the gate of the anode-gate thyristor to the anode of diode D1;
  although, in the cross-sectional view, this metallization is shown as formed of two separate portions, it should be understood that it is one and the same metallization,
  a metallization M4 connected to terminal −V in contact with the base of transistor T1, and
  a metallization M5 connected to terminal +V in contact with the cathode of diode D1.

This structure enables to control thyristor Th1 with a very low turn-on current while this thyristor can have a high hold current (Ih). The implementation of thyristor Th2 by triple diffusion enables to obtain a sensitive thyristor.

More heavily-doped regions of same type as the underlying regions for improving the ohmicity of the contacts with the various metallizations have further been shown in the drawing. These regions are neither referenced, nor described, so as not to complicate the drawings and lengthen the description. Also, regions such as region 50 conventionally form channel stop regions to avoid the occurrence of leakage currents.

Figure 2A:
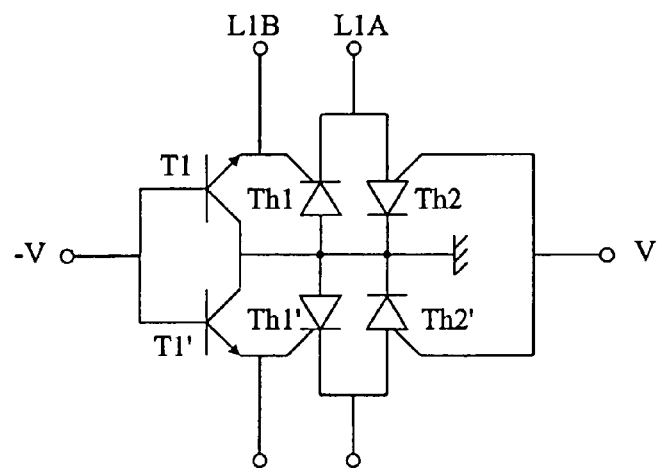
FIG. 2A shows an alternative of a protection circuit.

FIG. 2A shows an alternative of the circuit of FIG. 1A. Elements T1, Th1, Th2, T1', Th1', Th2' reappear therein. The difference with FIG. 1A is that the gate of anode-gate thyristor Th2 is not connected to the gate of cathode-gate thyristor Th1 and is directly connected, as well as the gate of anode-gate thyristor Th2' to positive reference voltage +V. This circuit is simpler but does not protect against positive overcurrents. It however has the advantage that the anode-gate thyristor is particularly sensitive due to the absence of anode short-circuits.

Figure 2B:
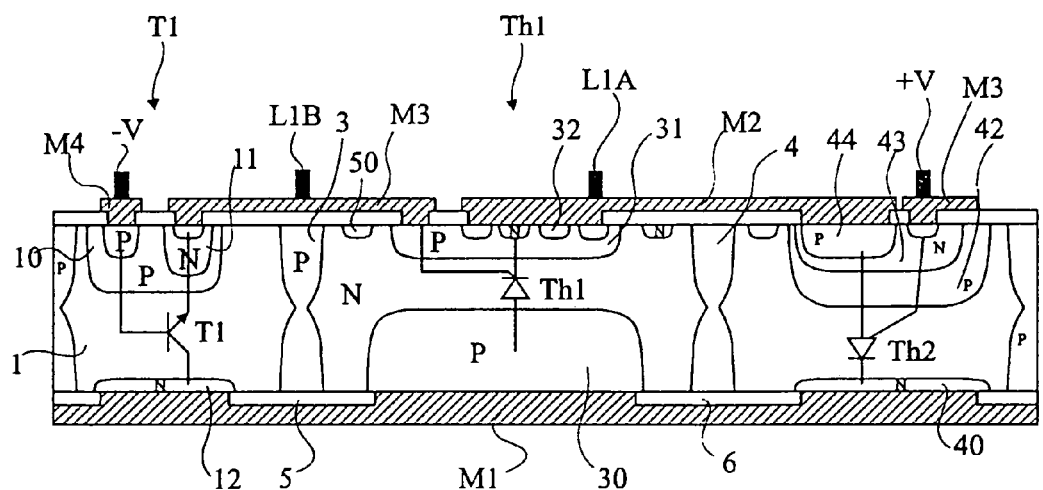
FIG. 2B shows an embodiment according to the present invention of the circuit of FIG. 2A.

The implementation of this circuit in the form of a monolithic component appears in FIG. 2B. This drawing will not be described in detail since it is strictly similar to FIG. 1B without diode D1, that is, anode-gate region 43 of anode-gate thyristor Th2 is directly connected to positive voltage +V. It should also be noted that anode layer 44 of the anode-gate thyristor is not, in the embodiment of FIG. 2B, provided with emitter short-circuits, which enables to obtain a more sensitive thyristor.

On the other hand, in the case of FIGS. 1B and 2B, insulating layer 6 has been shown to extend to cathode contacting region 40 of anode-gate thyristor Th2. Of course, since this contact layer is of the same type as the substrate, insulating layer 6 can stop immediately beyond the smaller surface of isolating wall 4.

Figure 3A:
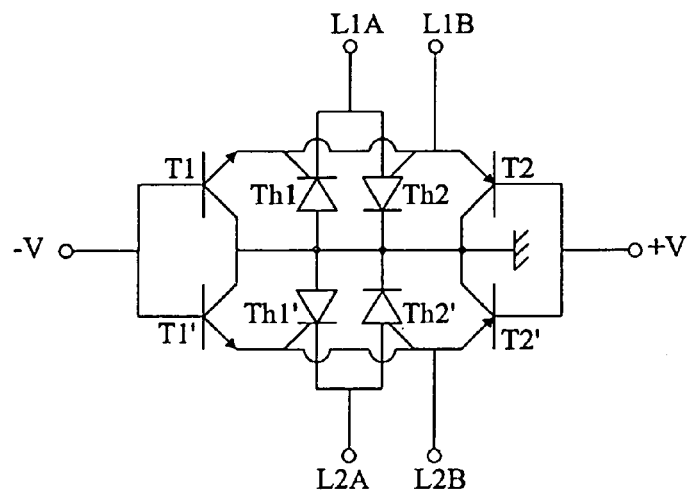
FIG. 3A shows another alternative of a protection circuit.

FIG. 3A shows another alternative of the circuit according to the present invention. This time, the structure is completely symmetrical, that is, anode-gate thyristor Th2 is, like cathode-gate thyristor Th1, associated with a gate current amplification transistor. This transistor is designated with reference T2 for thyristor Th2 and with reference T2' for thyristor Th2'. Transistors T2 and T2' are PNP transistors while transistors T1 and T1' are NPN transistors.

Figure 3B:
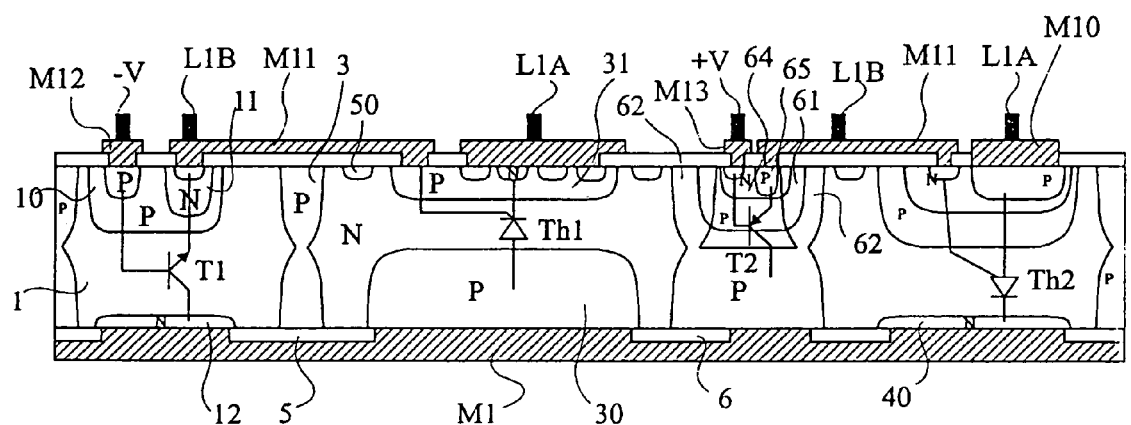
FIG. 3B shows a first embodiment according to the present invention of the circuit of FIG. 3A.

An implementation according to the present invention in monolithic form of the circuit of FIG. 3A appears in a simplified cross-section in FIG. 3B. Transistor T1 and transistor Th1 are implemented in the same way as in the embodiments of FIGS. 1B and 2B. Thyristor Th2 is implemented in the same way as that of FIG. 1B or of FIG. 2B according to the sensitivity desired for this thyristor. Transistor T2 is implemented between the wells containing thyristors Th1 and Th2. The collector of this transistor is formed of a P-type layer 61 deeply diffused from the upper surface. Region 61 is surrounded with a P-type drive-in 62 which joins a P-type region 63 formed from the lower surface and on which is recovered the collector contact by metallization M1. Inside collector region 61 are formed a base region 64 and a P-type emitter region 65.

A first upper surface metallization M10 connected to terminal L1A is in contact with the cathode of thyristor Th1 and the anode of thyristor Th2 (although this metallization is shown in two portions in the drawing, it is one and the same metallization). A metallization M11 connected to terminal L1B is in contact with the gate of thyristor Th2, the emitter of transistor T2, the gate of thyristor Th1, and the emitter of transistor T1. A metallization M12 connected to terminal −V is in contact with the base of transistor T1. A metallization M13 connected to terminal +V is in contact with the base region of transistor T2.

Figure 4A:
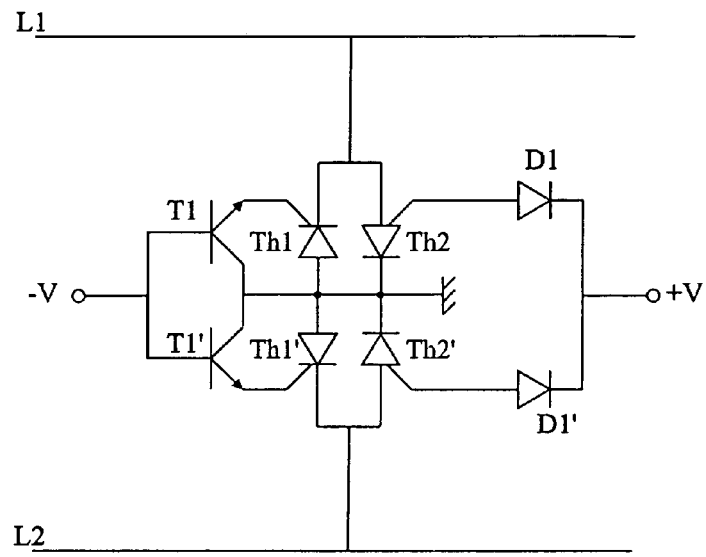
FIG. 4A shows another alternative of a protection circuit.

FIG. 4A shows an alternative of the circuit of FIG. 1A. This simpler circuit does not protect against overcurrents. Elements T1, Th1, Th2, T1', Th1', Th2' reappear therein. The difference with FIG. 1A is that the gates of anode-gate thyristor Th2 and cathode-gate thyristor Th1 are neither interconnected, nor connected to terminal LIB which does not exist, resistor R1 being absent.

Figure 4B:
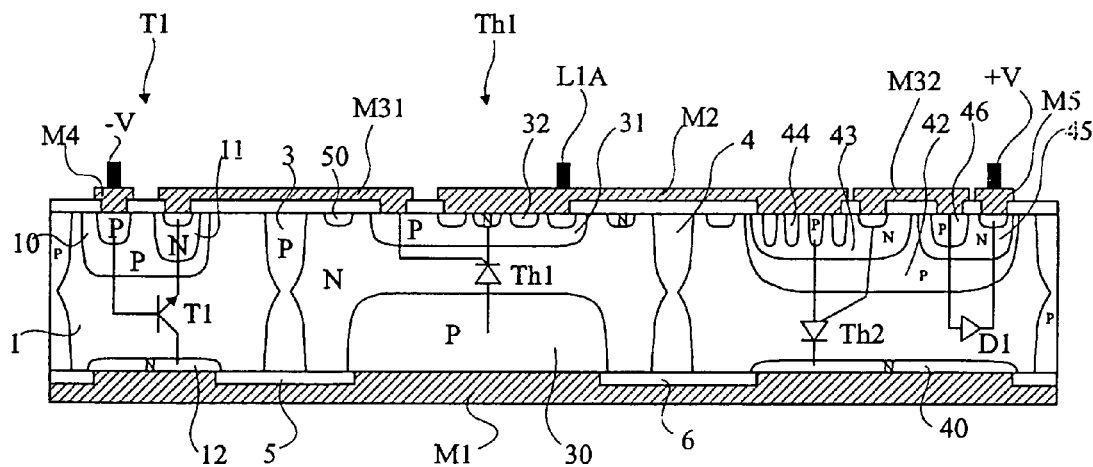
FIG. 4B shows a first embodiment according to the present invention of the circuit of FIG. 4A.

The implementation of this circuit in the form of a monolithic component appears in FIG. 4B. This drawing will not be described in detail since it is identical to FIG. 1B except for the gate metallization: instead of having a single metallization M3, there are two separate metallizations M31 and M32 only used, respectively, to establish the connection with the emitter of transistor T1 and the connection with the anode of diode D1 (diode D1 may possibly be eliminated).

Of course, the present invention is likely to have various alterations, modifications, and improvements which will readily occur to those skilled in the art. In particular, the various described alternatives may be combined.

What is claimed is:

1. A monolithic component protecting a line against overvoltages greater than a determined positive threshold or lower than a determined negative threshold, including in antiparallel a cathode-gate thyristor and an anode-gate thyristor connected between a first terminal of the line to be protected and a reference voltage, the gate of the cathode-gate thyristor being connected to a negative threshold voltage via a gate current amplification transistor, the gate of the anode-gate thyristor being connected to a positive threshold voltage, characterized in that:

the monolithic component is made in a substrate of a first conductivity type divided into wells separated by isolating walls, lower surfaces of the isolating walls being coated with insulating layers, a lower surface of the substrate being uniformly coated with a lower surface metallization, the gate current amplification transistor of the cathode-gate thyristor is made in vertical form in a first well, the cathode-gate thyristor is implemented in vertical form in a second well, the lower surface metallization links up the collector of the transistor, the anode of the cathode-gate thyristor, and the cathode of the anode-gate thyristor, a first front surface metallization connects the cathode of the cathode-gate thyristor to the anode of the anode-gate thyristor, a second front surface metallization connects the gate of the cathode-gate thyristor to the emitter of the transistor, and a third front surface metallization is in contact with the gate of the anode-gate thyristor.

2. The component of claim 1, further including a diode, the anode of which is connected to the gate of the anode-gate thyristor, characterized in that the diode is implemented in the form of a P-type region itself formed in an N-type region, the latter being formed in the cathode-gate region of the anode-gate thyristor, on the upper surface side of the component.

3. The component of claim 1, wherein the gate of the cathode-gate thyristor is connected to a second terminal of the line to be protected.

4. The component of claim 1, further ensuring a protective function against overcurrents, in which the gates of the cathode-gate and anode-gate thyristors are interconnected and connected to a second terminal of the line to be protected.

5. The component of claim 4, further including a gate current amplification transistor associated with the anode-gate thyristor, characterized in that this transistor, of PNP type, is formed on the upper surface of the component, a collector region extending via isolating walls towards the lower surface and being in contact with the lower surface metallization.

6. A monolithic component for protecting a line against overvoltages, comprising:

a substrate of a first conductivity type divided into wells separated by isolating walls, lower surfaces of the isolating walls being coated with insulating layers;

a gate current amplification transistor fabricated in vertical form in a first well in the substrate;

a cathode-gate thyristor fabricated in vertical form in a second well in the substrate;

an anode-gate thyristor fabricated in vertical form in a third well in the substrate;
a lower surface metallization connecting the collector of the transistor, the anode of the cathode-gate thyristor, and the cathode of the anode-gate thyristor;
a first front surface metallization connecting the cathode of the cathode-gate thyristor to the anode of the anode-gate thyristor; and
a second front surface metallization connecting the gate of the cathode-gate thyristor to the emitter of the transistor.

7. A monolithic component as defined in claim 6, further comprising a third front surface metallization in contact with the gate of the anode-gate thyristor.

8. A monolithic component as defined in claim 6, further comprising a diode, an anode of which is connected to the gate of the anode-gate thyristor.

9. A monolithic component as defined in claim 8, wherein the diode is implemented as a P-type region formed in an N-type region, the N-type region being formed in the cathode-gate region of the anode-gate thyristor on the front surface of the substrate.

10. A monolithic component as defined in claim 6, further comprising a second gate current amplification transistor associated with the anode-gate thyristor.

11. A monolithic component as defined in claim 10, wherein the second transistor is formed on the front surface of the substrate, a collector region extending via isolating walls toward the lower surface and being in contact with the lower surface metallization.

12. A monolithic component as defined in claim 6, wherein the cathode-gate thyristor and the anode-gate thyristor are connected in antiparallel between a first terminal of the line to be protected and a reference voltage, the gate of the cathode-gate thyristor being connected to a negative threshold voltage via the gate current amplification transistor and the gate of the anode-gate thyristor being connected to a positive threshold voltage.

13. A monolithic component as defined in claim 12, wherein the gate of the cathode-gate thyristor is adapted for connection to a second terminal of the line to be protected.

14. A monolithic component as defined in claim 12, wherein the gates of the cathode-gate and anode-gate thyristors are interconnected and are configured for a connection to a second terminal of the line to be protected.

* * * * *